US012761251B2

(12) United States Patent
Qu et al.

(10) Patent No.: US 12,761,251 B2
(45) Date of Patent: Oct. 13, 2026

(54) CURRENT SENSING SYSTEM AND DC-DC CONVERTER COMPRISING THE SAME

(71) Applicant: NEXPERIA B.V., Nijmegen (NL)

(72) Inventors: Yong Qu, Manchester (GB); Katarzyna Nowak, Nijmegen (NL); Joel Turchi, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 543 days.

(21) Appl. No.: 18/337,182

(22) Filed: Jun. 19, 2023

(65) Prior Publication Data

US 2023/0408556 A1 Dec. 21, 2023

(30) Foreign Application Priority Data

Jun. 20, 2022 (EP) .................................... 22179832

(51) Int. Cl.
*G01R 19/10* (2006.01)
*G01R 19/32* (2006.01)
(Continued)

(52) U.S. Cl.
CPC ............. *G01R 19/10* (2013.01); *G01R 19/32* (2013.01); *H02M 1/0009* (2021.05); *H02M 3/158* (2013.01)

(58) Field of Classification Search
CPC .... G01R 19/10; G01R 19/32; G01R 19/0092; H02M 1/0009; H02M 1/088; H02M 3/158; H02M 3/1588
See application file for complete search history.

(56) References Cited

U.S. PATENT DOCUMENTS

2014/0253089 A1* 9/2014 Qin ........................ H02M 3/158 323/312
2014/0285178 A1* 9/2014 Williams ........... G01R 19/0092 324/76.11
(Continued)

FOREIGN PATENT DOCUMENTS

CN 107134920 A * 9/2017 .......... H02M 1/0009

OTHER PUBLICATIONS

Huang, Xiucheng & Liu, Zhengyang & Li, Qiang & Lee, F.C.Y.. (2013). "Evaluation and application of 600V GaN HEMT in cascode structure," Power Electronics, IEEE Transactions on. 29 (Year: 2013).*

*Primary Examiner* — Monica Lewis
*Assistant Examiner* — Jye-June Lee
(74) *Attorney, Agent, or Firm* — Ruggiero McAllister & McMahon LLC

(57) ABSTRACT

A system for sensing a current through a transistor is provided and a DC-DC converter including one or more such systems. The system includes a transistor module, including: a primary transistor electrically connected between a first and a second terminal; and a secondary transistor electrically connected between the first and a third terminal, a control terminal of the secondary transistor is electrically connected to a control terminal of the primary transistor. The system includes a current sensing module electrically connected to the transistor module and having an output terminal. The system is operable in a first mode in which the current sensing module outputs, at the output terminal, a first output signal indicative of a current through the primary transistor in a first current direction based on a voltage difference between the third and the second terminal, the first current direction being from the first to the second terminal.

19 Claims, 5 Drawing Sheets

(51) Int. Cl.
*H02M 1/00* (2006.01)
*H02M 3/158* (2006.01)

(56) References Cited

U.S. PATENT DOCUMENTS

| | | | | |
|---|---|---|---|---|
| 2014/0375342 | A1* | 12/2014 | Chuah ................ | G01R 19/0046 324/72 |
| 2019/0140630 | A1* | 5/2019 | Chen ................ | H03K 17/08104 |
| 2019/0245382 | A1* | 8/2019 | Liu .................... | G01R 19/0092 |
| 2022/0182048 | A1* | 6/2022 | Liu ..................... | H02M 1/0009 |
| 2023/0396141 | A1* | 12/2023 | Abesingha ............ | H02M 3/158 |

* cited by examiner

CURRENT SENSING SYSTEM AND DC-DC CONVERTER COMPRISING THE SAME

CROSS-REFERENCE TO RELATED APPLICATIONS

This application claims the benefit under 35 U.S.C. § 119(a) of European Application No. 22179832.5 filed Jun. 20, 2022, the contents of which are incorporated by reference herein in their entirety.

BACKGROUND

1. Field of the Disclosure

Aspects of the present disclosure generally relate to a system for sensing a current through a transistor. Aspects of the present disclosure further relate to a DC-DC converter comprising one or more such systems. Aspects of the present disclosure are especially suitable for sensing a current through power switching transistors, such as power MOSFETs.

2. Description of the Related Art

Transistors are used in electronic circuits in a variety of applications. Such applications may benefit or even necessitate that a current through one or more specific transistors is measured and regulated accordingly. One such application concerns DC-DC converters, in which a transistor is used as a switching element and can typically conduct a relatively large current.

Hereinafter, a DC-DC converter 100 known in the art is described with reference to FIG. 1, serving as an example only. DC-DC converter 100 comprises an input voltage supply $V_I$, a converter module 101, an output capacitor $C_O$ and a load $Z_L$. Converter module 101 comprises an input capacitor $C_I$, a switching module 102, a drive module 103, and an inductor $L_O$. In some embodiments, output capacitor $C_O$ may be included in converter module 101, and/or one or both of input capacitor $C_I$ and inductor $L_O$ may be external to converter module 101.

Switching module 102 comprises a high-side transistor $M_H$ and a low-side transistor $M_L$, which are metal-oxide-semiconductor field-effect transistors (MOSFETs) in the example shown in FIG. 1. A gate terminal of each of transistors $M_H$, $M_L$ is driven by driving module 103. Driving module 103 may be controlled by an external controller (not shown), such as a processor or a microcontroller, and may drive transistors $M_H$, $M_L$ using, for example, pulse-width modulated (PWM) signals. An input voltage received from input voltage supply $V_I$ may be provided to an input port of converter module 101, which is configured to convert said input voltage into an output voltage having a different voltage level by controlling transistors $M_H$, $M_L$ accordingly using driving module 103. In some applications, a feedback configuration can be realized by controlling driving module 103 based at least on the output voltage of converter module 101. Nevertheless, open-loop control without using the output voltage to control driving module 103 is also possible.

Input voltage supply $V_I$ may be a stable voltage source, such as a battery of an electronic device comprising said DC-DC converter 100. Converter module 101 may be configured to provide, at its output, an output voltage having a voltage level and a corresponding ripple. The skilled person will readily understand that characteristics of the output voltage signal, such as its voltage level and the ripple, may be determined or dictated by at least one of the input voltage, the switching frequency and drive strength (i.e., applied voltage level) for transistors $M_H$, $M_L$ as provided by driving module 103, device characteristics of transistors $M_H$, $M_L$, a shaping circuit formed by inductor $L_O$ and output capacitor $C_O$, and load $Z_L$, among others. The output voltage signal can be applied to load $Z_L$ to deliver power thereto.

The exemplary DC-DC converter shown in FIG. 1 may be recognized as a synchronous buck (or step-down) converter. Hence, high-side transistor $M_H$ and low-side transistor $M_L$ may be synchronously driven such that only one of said transistors $M_H$, $M_L$ is activated at any time. As such, a current $I_L$ through inductor $L_O$ will correspond substantially to a current through either high-side transistor $M_H$ or low-side transistor $M_L$ Alternatively to the configuration shown in FIG. 1, low-side transistor $M_L$ can be replaced with a diode, and switching module 102 only comprises (high-side) transistor $M_H$, which configuration may be recognized as a standard buck converter. Other types of converters may similarly comprise switching transistors, including but not limited to boost (or step-up) converters, buck-boost or boost-buck converters (bidirectional), transformer based converters, or the like, as appreciated by the person skilled in the art. Furthermore, the present disclosure also concerns transistors used in other applications beyond power converters.

During operation, high-side transistor $M_H$ and/or low-side transistor $M_L$ may conduct a relatively large current. It may be of great importance to ensure that certain transistors operate correctly and conduct a current in a desired current range for safety reasons or for the purpose of controlling the transistors accordingly based on said current(s). This may especially apply to complex systems comprising a plurality of such transistors.

An example of such a complex system may be an electronic device that may comprise a plurality of DC-DC converters for converting an input voltage (or a plurality of input voltages) to a plurality of respective output voltage levels. In another example, the electronic device may comprise a multi-phase DC-DC converter, as appreciated by the person skilled in the art, which also comprises a plurality of individual converter modules, each with their own switching transistors.

Depending on the application, a current may flow in one or either direction through the transistor, e.g., from drain to source or from source to drain in the case of a MOS transistor. In particular, in DC-DC converter 100 shown in FIG. 1, it may occur that a current flows from drain to source through low-side transistor $M_L$ (i.e., top terminal to bottom terminal in FIG. 1) for a certain period of time, which may be referred to as a 'negative current' reflecting the direction indicated for current $I_L$.

Although the description above primarily focuses on DC-DC converters, it is noted that other applications involving transistors can similarly benefit significantly from being able to effectively and efficiently sense a current through a transistor.

SUMMARY

As apparent from the above, there is a need for a system including one or more transistors in which a current can be sensed through said transistor(s) in an effective and efficient manner, for example with the purpose of more precise regulation of the output voltage level of the DC-DC converter.

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

According to an aspect of the present disclosure, a system is provided. The system comprises a transistor module, comprising a primary transistor electrically connected between a first terminal and a second terminal, and a secondary transistor electrically connected between the first terminal and a third terminal, wherein a control terminal of the secondary transistor is electrically connected to a control terminal of the primary transistor. The system further comprises a current sensing module electrically connected to the transistor module and having an output terminal.

In accordance with the present disclosure, the system is configured to be operable in a first mode in which the current sensing module is configured to output, at the output terminal, a first output signal indicative of a current through the primary transistor in a first current direction based on a voltage difference between the third terminal and the second terminal, the first current direction being from the first terminal to the second terminal.

By using the system according to the present disclosure, the current sensing module does not need to be designed for potential high voltages at its input. In particular, when the primary transistor and secondary transistor are activated via their control terminal by a driving signal, the primary transistor may conduct a current accordingly and a voltage at the first terminal may be relatively low. However, when the primary transistor and secondary transistor are deactivated during operation, the voltage at the first terminal may be controlled by other elements or circuitry external to the system, such as a high-side switching transistor in the case of a synchronous DC-DC converter. This voltage may be relatively high compared to the voltage when the primary transistor and the secondary transistor are activated.

In other words, by including the secondary transistor as described above and sensing the current through the primary transistor based on the voltage across the third terminal and the second terminal, the current sensing module does not need to be directly electrically connected to the first terminal and is thus prevent or limited from being exposed to relatively high voltages.

Moreover, as described further below, current sensing in a second current direction opposite the first current direction can be implemented without including additional terminals to the transistor module, allowing for an area-efficient current sensing implementation.

The current sensing module may comprise a first sensing unit. The first sensing unit may comprise a first comparing unit having a first input terminal and a second input terminal and being configured to compare a voltage at an intermediate node, said voltage being received at the first input terminal, to a voltage corresponding to the voltage difference between the third terminal and the second terminal, received at the second input terminal, and to generate a first control signal based on a result of said comparison. Additionally, the first sensing unit may further comprise a first transistor connected between the output terminal of the current sensing module and the intermediate node. The first transistor may be configured to receive, at a control terminal thereof, the first control signal, and to enable a first current to flow between the output terminal and the intermediate node based on said first control signal. Said first current may correspond to the first output signal or may be used to generate the first output signal. In other words, the first current may either directly or indirectly correspond to the first output signal.

The first sensing unit may further comprise an electrical network that is electrically connected between the first transistor and a reference terminal connected to a reference voltage, and the first current may additionally flow through said electrical network. Furthermore, the first comparing unit and the first transistor may together form at least part of a first negative feedback loop configured to adjust the first current such that the voltage at the first input terminal and the voltage at the second input terminal are substantially equal. The adjusted first current may correspond to the first output signal or may be used to generate the first output signal.

The electrical network may comprise a compensation transistor, and the current sensing module may further comprise a temperature compensation unit configured to sense a temperature at or near the primary transistor and to control a control terminal of the compensation transistor such that an on-resistance of the compensation transistor substantially corresponds to that of the primary transistor during operation.

Using the temperature compensation unit and the compensation transistor, a change in temperature of the primary transistor can be compensated for by adjusting a voltage at the control terminal of the compensation transistor, thereby changing its on-resistance. Said voltage can be adjusted based on a temperature at or near the primary resistor. In some embodiments, the temperature compensation unit can disable the temperature compensation by applying a same voltage to the control terminal of the compensation transistor as to the control terminal of the primary transistor. Here, it is noted that the compensation transistor may have a similar size (i.e., the same effective width) as the primary transistor, or be the relatively scaled version of the primary transistor size, which characteristics may be accounted for in the temperature compensation unit. The control from the temperature compensation unit may be implemented in various ways, such as using an mathematical function implemented by an analog circuit, a predefined model, or a look-up table.

The current sensing module may comprise a first switch configured to, when the system is operating in the first mode, provide a first voltage signal corresponding to the voltage difference between the third terminal and the second terminal to the output terminal of the current sensing module. Said first voltage signal may correspond to the first output signal or may be used to generate the first output signal. In a further embodiment, the system may further comprise a temperature compensation unit configured to adjust the first voltage signal based on a temperature at or near the primary transistor.

The current sensing module may further comprise an amplifying unit electrically connected between the transistor module and the first sensing unit. The amplifying unit may be configured to amplify the voltage difference between the third terminal and the second terminal. In addition, the current sensing module may then be configured to generate the first signal based on the amplified voltage difference between the third terminal and the second terminal.

The system may be further configured to be operable in a second mode in which the sensing module is configured to output, at the output terminal, a second output signal indicative of a current through the primary transistor in a second current direction, the second current direction being from the second terminal to the first terminal, which may be referred to as a ‘positive current’. To output the second output signal, the current sensing module may be configured to adjust a current through the secondary transistor such that a voltage at the third terminal substantially equals a voltage at the second terminal, and to output the second output signal based on the adjusted current.

The current sensing module described above, and thus being operable in both the first mode and the second mode, enables employing a bidirectional current sensing technique whilst only using one additional terminal in addition to the terminals of the primary transistor. As a result, a bidirectional current sensing module can be realized in an area-efficient and cost-effective manner.

The current sensing module may comprise a second sensing unit. The second sensing unit may comprise a second comparing unit configured to compare a voltage at the second terminal to a voltage at the third terminal, and to generate a second control signal based on a result of said comparison. The second sensing unit may further comprise a second transistor connected between the third terminal and a reference terminal. The second transistor may be configured to receive the second control signal at a control terminal thereof, and to enable a second current to flow from the reference terminal to the secondary transistor through said second transistor based on said second control signal. Said second current may correspond to the second output signal or may be used to generate the second output signal.

The second comparing unit and the second transistor may together form at least part of a second negative feedback loop configured to adjust the second current such that the voltage at the second terminal and the voltage at the third terminal are substantially equal.

The current sensing module may further comprise a current mirror configured to receive the second current in a first branch thereof and to generate a scaled second current signal corresponding to the second current times a predetermined factor in a second branch thereof. The second branch of the current mirror may be directly or indirectly electrically connected to the output terminal. The second current signal may correspond to the second output signal, or may be fed into a resistor to generate a second voltage signal corresponding to the second output signal.

The current sensing module may further comprise a second switch configured to, when the system is operating in the second mode provide the second voltage signal to the output terminal of the current sensing module as the second output signal.

The system may further comprise a third transistor electrically connected between the second terminal and the third terminal, and a blanking unit configured to generate a pulse having a predetermined width and to provide said pulse to a control terminal of the third transistor based on a voltage signal at the control terminal of the primary and secondary transistor. The pulse may be configured to enable the third transistor to form a low-impedance path between the second terminal and the third terminal for a duration corresponding to the predetermined width.

The primary transistor and the secondary transistor may have a scale ratio of $N_S$:1, respectively. In some embodiments, $N_S$ may be greater than unity. As a result, additional power consumption due to a current flowing through the secondary transistor can be minimized. As an example, $N_S$ may be greater than 10, preferably greater than 100, and more preferably greater than 1,000. In some embodiments, $N_S$ may be equal to 10,000 or even higher.

The primary transistor and the secondary transistor may be integrated on a same semiconductor die. In some embodiments, the electrical connection between the terminals of the primary and secondary transistor may be implemented in an integrated manner on the semiconductor die. As a result, only four terminals for external contact need to be arranged on the semiconductor die to realize the transistor module, allowing for an area-efficient and cost-effective implementation of the transistor module while nonetheless enabling negative or bidirectional current sensing by the current sensing module in the system. Alternatively, the primary transistor may be integrated on a first semiconductor die and the secondary transistor may be integrated on a second semiconductor die separate from the first semiconductor die.

The current sensing module may be partially or even fully realized as an integrated circuit. The current sensing module may be at least partially integrated on a third semiconductor die different from the semiconductor die(s) on which the primary transistor and/or the secondary transistor are integrated, though the present disclosure is not limited thereto. In some embodiments, the current sensing module is at least partially realized using discrete components rather than integrated components.

The primary transistor and the secondary transistor may be metal-oxide-semiconductor field-effect transistors (MOSFETs). Furthermore, in some embodiments, one or more of the above-described first transistor, second transistor and third transistor may be a MOSFET. As an example only, the primary transistor and the secondary transistor may be n-type enhancement mode MOSFETs.

The transistor module may further comprise a power transistor electrically connected between the first terminal and a fifth terminal. A control terminal of the power transistor may be electrically connected to the second terminal or to a reference voltage. The current through the primary transistor additionally substantially flows through the power transistor.

Since the current through the primary transistor is substantially equal to the current through the power transistor due to the series-connection, a sensed current through the primary transistor using the system according to the present disclosure also substantially reflects the current through the power transistor.

The power transistor may be configured to be always on (i.e., activated), and a current path from the fifth terminal to the second terminal may be provided by activating the primary transistor to enable a current flow between the first terminal and the second terminal.

In a preferred embodiment, the power transistor may be a Gallium Nitride, ‘GaN’, based high electron mobility transistor, ‘HEMT’, and may be a depletion mode transistor, and the primary transistor may be Silicon, ‘Si’, based. The power transistor may be integrated on a fourth semiconductor die different from the semiconductor die(s) on which the current sensing module, the primary transistor and the secondary transistor are integrated.

Moreover, the power transistor may have a higher voltage handling capability than the primary transistor. To that end, the use of a GaN HEMT device as the power transistor is especially useful, since this type of transistor and its technology typically allow for a relatively high voltage rating. Rather than directly connecting the primary transistor to external circuitry, the power transistor may be connected thereto instead. When the power transistor is rated at a higher voltage, it can handle high voltages imposed on the fifth terminal by external circuitry and can thereby protect a remainder of the system from such high voltages. A voltage rating or voltage handling capability may, for example, reflect a breakdown voltage of the transistor.

According to another aspect of the present disclosure, a DC-DC converter is provided. The DC-DC converter comprises a first system configured as the system in accordance with the above. The primary transistor of the first system corresponds to a switching transistor of the DC-DC converter.

The DC-DC converter may further comprise a second system configured as the system in accordance with the above. The DC-DC converter may comprise a high-side switching transistor and a low-side switching transistor. In that case, the primary transistor of the first system may correspond to a high-side switching transistor of the DC-DC converter, and a primary transistor of the second system may correspond to a low-side switching transistor of the DC-DC converter.

BRIEF DESCRIPTION OF DRAWINGS

Next, the present disclosure will be described in more detail with reference to the appended drawings, wherein.

Figure 1:
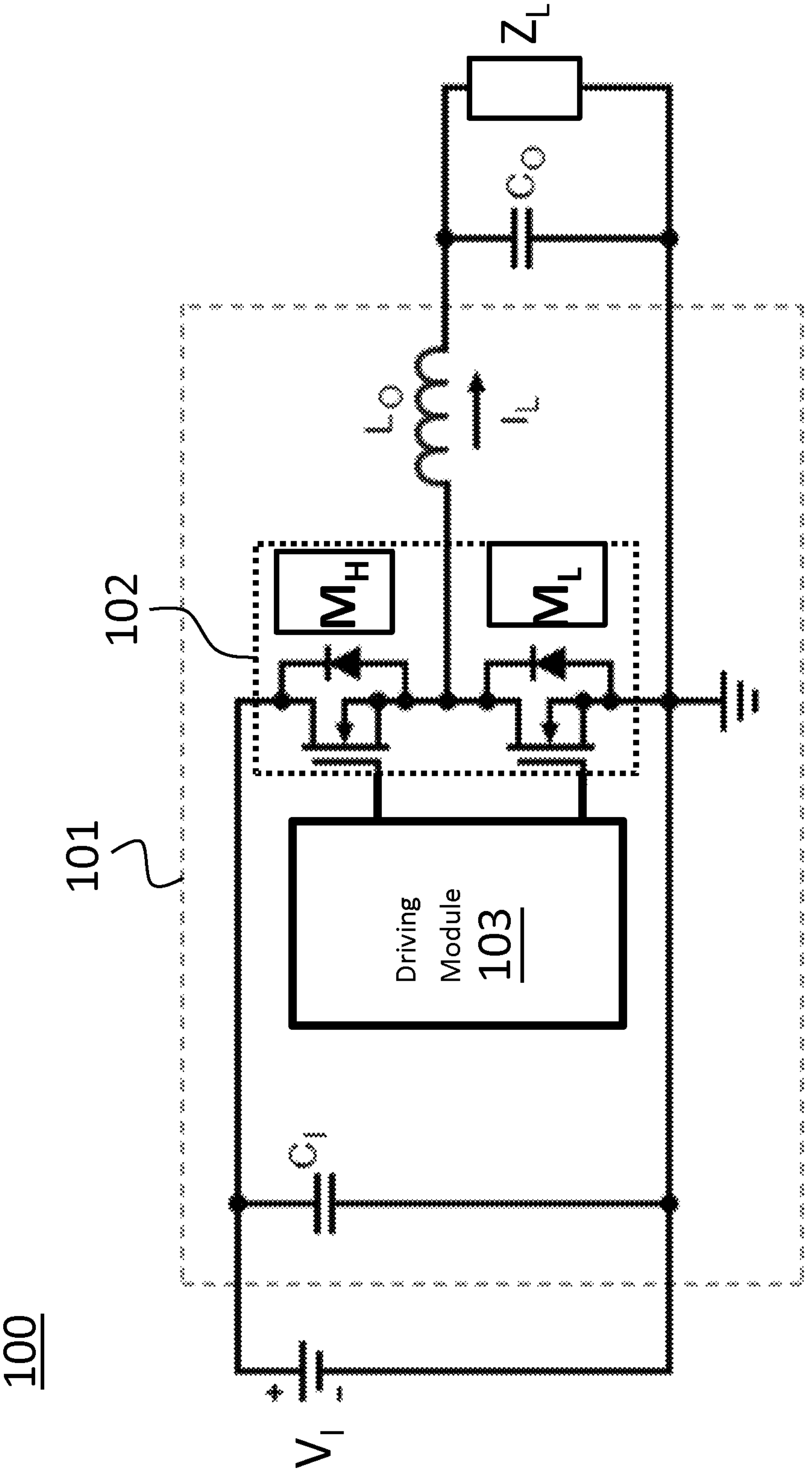
FIG. 1 is a schematic diagram of a DC-DC converter known in the art.

The present disclosure is described in conjunction with the appended FIGS. It is emphasized that, in accordance with the standard practice in the industry, various features are not drawn to scale. In fact, the dimensions of the various features may be arbitrarily increased or reduced for clarity of discussion.

In the appended FIGS., similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the detailed description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the detailed description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms.

Figure 2A:
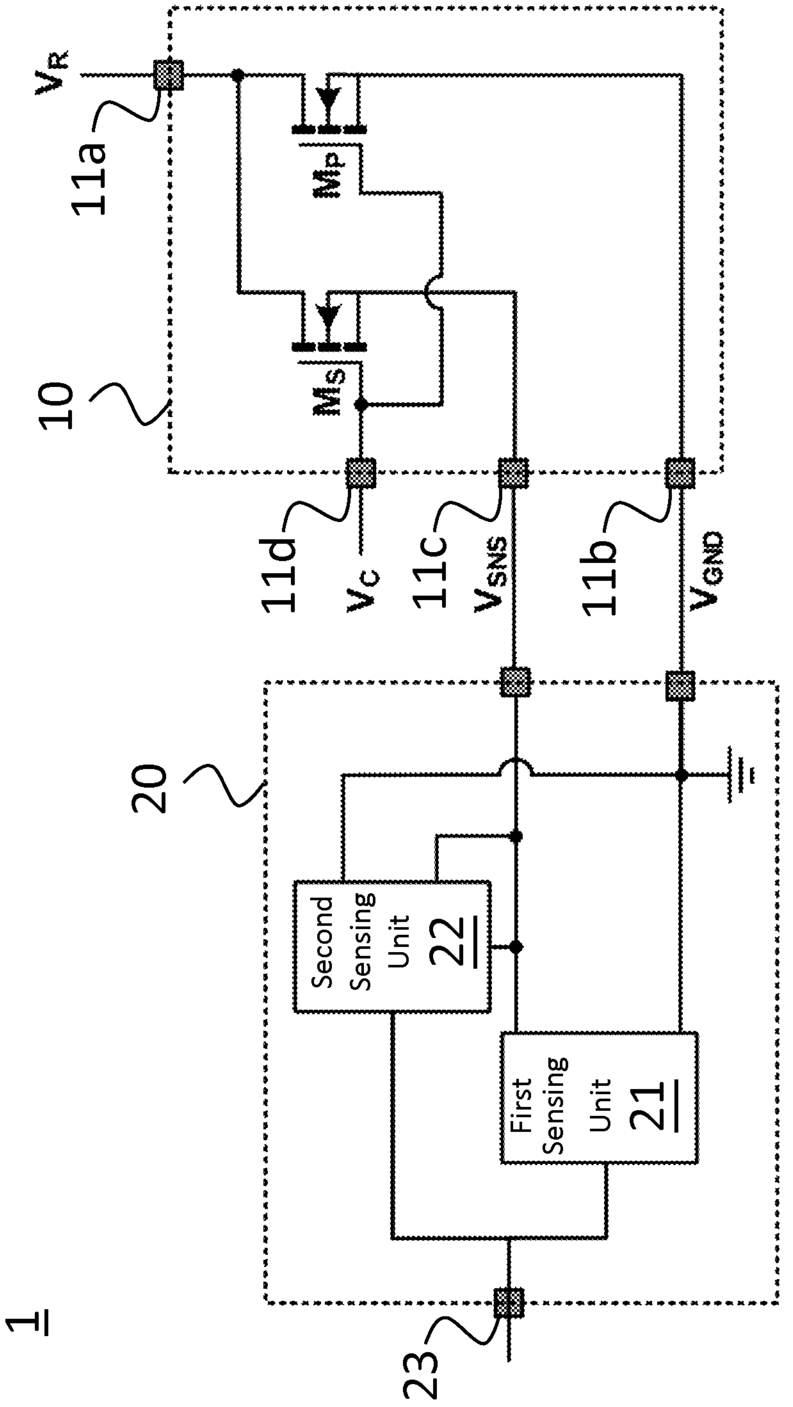
FIG. 2A is a schematic diagram of a system in accordance with an embodiment of the present disclosure.

In FIG. 2A, a system 1 in accordance with an embodiment of the present disclosure is shown. System 1 (e.g., an electrical circuit) comprises a transistor module 10 having a first terminal 11*a*, a second terminal 11*b*, a third terminal 11*c* and a fourth terminal 11*d*. Transistor module 10 further comprises a primary transistor $M_P$ electrically connected between first terminal 11*a* and second terminal 11*b*, as well as a secondary transistor $M_S$ electrically connected between first terminal 11*a* and third terminal 11*c*. A control terminal of primary transistor $M_P$ and a control terminal of secondary transistor $M_S$ are each electrically connected to fourth terminal 11*d*. System 1 further comprises a current sensing module 20, which in turn may comprise a first sensing unit 21, a second sensing unit 22, and an output terminal 23. Each of first sensing unit 21 and second sensing unit 22 may be electrically connected to transistor module 10 as well as to output terminal 23.

Here, it is noted that a transistor being electrically connected between two terminals is defined as the drain or collector terminal of the transistor being electrically connected to one of said two terminals, and the source or emitter terminal being electrically connected to the other of said two terminals. As a result, a current can flow between the two terminals under appropriate operating conditions, such as a particular gate-source voltage or base-emitter voltage. Furthermore, a 'control terminal' of the transistor is herein defined as the gate terminal or base terminal of the transistor, whichever applies.

Furthermore, in FIG. 2A, a symbol used for primary transistor $M_P$ and secondary transistor $M_S$ corresponds to an n-type enhancement mode MOSFET. However, it is noted that the present disclosure is not limited thereto. Primary transistor $M_P$ and secondary transistor $M_S$ may each be of a different type, i.e., a different type of MOSFET, such as a depletion-mode transistor and/or a p-type transistor, a different type of FET such as a junction FET (JFET), or a different type of transistor altogether such as a bipolar junction transistor (BJT) or an insulated-gate bipolar transistors (IGBTs). Furthermore, although generally preferred, primary transistor $M_P$ does not need to be of the same type as secondary transistor $M_S$. Similarly, any other transistor referred to in the ensuing description below may be of the same type as either of primary transistor $M_P$ and secondary transistor $M_S$, or one or more of said transistors may be of a different type.

Primary transistor $M_P$ and secondary transistor $M_S$ can be activated by applying a control voltage $V_C$ to the control terminals thereof via fourth terminal 11*d*. Depending on said control voltage $V_C$ as well as a voltage at first terminal 11*a* and second terminal 11*b*, a current will flow through primary transistor $M_P$ in a first current direction from first terminal 11*a* to second terminal 11*b*, or in a second current direction from second terminal 11*b* to first terminal 11*a*. In this embodiment, the voltage at second terminal 11*b* may be a reference voltage, such as ground ($V_{GND}$).

System 1 as shown in FIG. 2A is operable in a first mode in which the current through primary transistor $M_P$ flows in the first current direction during operation. In this mode, due to the current flow, the voltage at first terminal 11*a* will increase with respect to the voltage at second terminal 11*b*. In particular, the voltage at first terminal 11*a* will be the voltage at second terminal 11*b* plus a voltage across primary transistor $M_P$, which voltage drop depends on the current through primary transistor $M_P$ and an on-resistance thereof. Assuming current sensing module 20 (e.g., each of first sensing unit 21 and second sensing unit 22) presents a relatively high impedance between second terminal 11*b* and third terminal 11*c* during at least part of the operation in the first mode, a current through secondary transistor $M_S$ and hence the voltage drop across secondary transistor $M_S$ will be relatively small. As a result, and since secondary transistor $M_S$ is also activated by control voltage $V_C$ the voltage $V_{SNS}$ at third terminal 11*c* will become substantially equal to the voltage at first terminal 11*a*. Current sensing module 20, or first sensing unit 21 in some embodiments, may then be configured to generate a first output signal indicative of the current in the first current direction based on a voltage difference between the voltage at third terminal 11*c* and the voltage at second terminal 11*b*, since said voltage difference is a function of this current. Said first output signal is then provided to output terminal 23.

In particular, the impedance presented by current sensing module 20 in the first mode may be large enough to prevent or at least limit a current through secondary transistor $M_S$ and thereby increase the accuracy. For example, the impedance presented by current sensing module 20 at third terminal 11*c* in the first mode may be at least 10 kΩ, preferably at least 100 kΩ, and more preferably at least 1 MΩ. Additionally or alternatively, the impedance presented by current sensing module 20 at third terminal 11*c* in the first mode may be larger than an on-resistance (i.e., channel resistance) of primary transistor $M_P$ and/or secondary transistor $M_S$ during normal operation when activated, for example at least 10× larger, preferably at least 100× larger, more preferably at least 1000× larger. For example, the channel resistance of primary transistor $M_P$ may be about 1 mΩ when driven at control terminal 11*d*, the channel resistance of the secondary transistor $M_S$ may be about 10Ω when driven at control terminal 11*d*, and the impedance presented by current sensing module 20 may be greater than 1 MΩ. However, the present application is not limited to any such values.

Current sensing module 20 may generate the first output signal in various ways. For example, a model or a look-up table may be used to relate the voltage difference to a particular current value and to generate an appropriate output signal as the first output signal. Other approaches in accordance with the present disclosure will be described with reference to FIGS. 3 and 4. The first output signal may be provided to a controller (not shown), which may be included in system 1 or may be external to system 1. Furthermore, the first output signal may be a voltage, a current, or the like, and may be digital or analog.

In addition to the above, system 1 may be operable in a second mode in which the current through primary transistor $M_P$ flows in the second current direction during operation. In this mode, contrary to the first mode, the voltage at first terminal 11*a* will decrease with respect to the voltage at second terminal 11*b* due to the current flow in the second current direction. In particular, the voltage at first terminal 11*a* will be the voltage at second terminal 11*b* minus a voltage across primary transistor $M_P$, which voltage drop depends on the current through primary transistor $M_P$ and an on-resistance thereof. Assuming current sensing module 20 (e.g., each of first sensing unit 21 and second sensing unit 22) initially presents a relatively high impedance between second terminal 11*b* and third terminal 11*c* during at least part of the operation in the first mode, a current through secondary transistor $M_S$ and hence the voltage drop across secondary transistor $M_S$ will be relatively small. As a result, and since secondary transistor $M_S$ is also activated by control voltage $V_C$ the voltage $V_{SNS}$ at third terminal 11*c* will become substantially equal to the voltage at first terminal 11*a*.

Current sensing module 20, or second sensing unit 22 in some embodiments, may then be configured to adjust a current through secondary transistor $M_S$ such that the voltage at third terminal 11*c* is substantially equal to the voltage at second terminal 11*b*. In this state, since the voltages at all corresponding terminals of primary transistor $M_P$ and secondary transistor $M_S$ are equal, a current through secondary transistor $M_S$ will be a function of at least the current through primary transistor $M_P$ and a relative of secondary transistor $M_S$ compared to primary transistor $M_P$. For example, when the voltages at all corresponding terminals are equal and primary transistor $M_P$ has an effective width or scale of $N_S$ times that of secondary transistor $M_S$, then the current through secondary transistor $M_S$ will be the current through primary transistor $M_P$ divided by said relative scaling $N_S$. The current through secondary transistor $M_S$ may in turn be used by current sensing module 20 (e.g., by second sensing unit 22) to generate a second output signal indicative of a current through primary transistor $M_P$ in the second current direction. Said second output signal may then be provided to output terminal 23.

Current sensing module 20 (e.g., second sensing unit 22) may generate the second output signal in various ways. For example, a model or a look-up table may be used to relate the current through secondary transistor $M_S$ to a particular current through primary transistor $M_P$ and to generate an appropriate output signal as the second output signal. Other approaches in accordance with the present disclosure will be described with reference to FIGS. 3 and 4. The second output signal may be provided to a controller (not shown), which may be included in system 1 or may be external to system 1. Furthermore, the second output signal may be a voltage or a current, and may be digital or analog.

When system 1 is operating in the first mode, second sensing unit 22 may be configured to be disabled manually or automatically, or may be configured to present a high impedance to transistor module 10, thereby having little to no impact on system 1 in this mode. This may for example be realized using a control mechanism operating based on a polarity of the voltage difference between second terminal 11*b* and third terminal 11*c*.

Similarly, when system 1 is operating in the second mode, first sensing unit 21 may be configured to be disabled manually or automatically, or may be configured to present a high impedance to transistor module 10, thereby having little to no impact on system 1 in this mode.

When system 1 is configured to be operable in either the first mode and the second mode, bidirectional current sensing can be realized for currents through primary transistor $M_P$. In the embodiment shown in FIG. 2A, secondary transistor $M_S$ may be effectively used as a sense transistor, and third terminal 11*c* may thus effectively form a sense terminal of transistor module 10. Nevertheless, only one additional terminal is required for transistor module 10 to enable current sensing not only in the first current direction, but also in the second current direction.

Figure 2B:
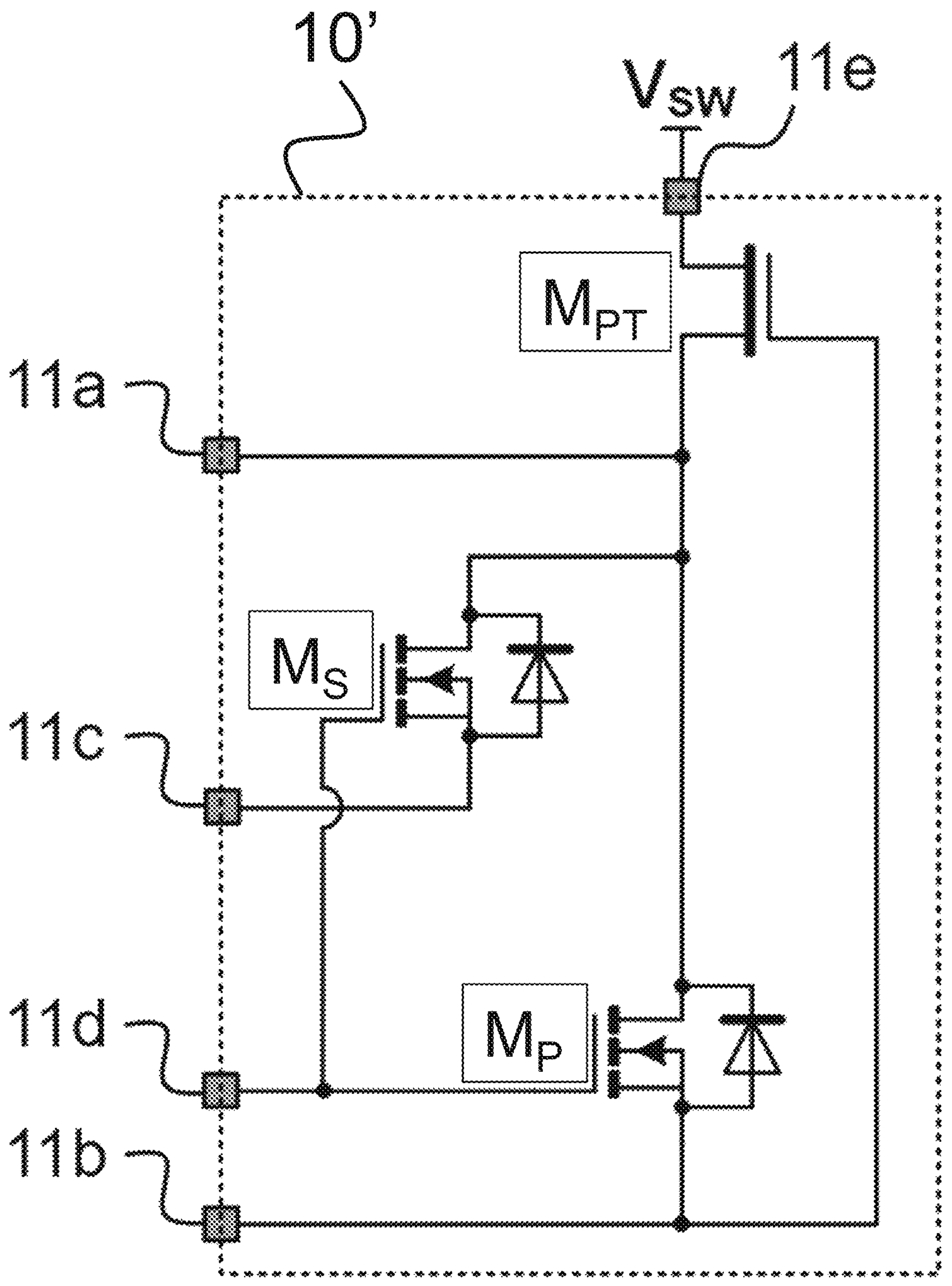
FIG. 2B is a schematic diagram of a transistor module of a system in accordance with an embodiment of the present disclosure.

In FIG. 2B, a transistor module 10' is shown. Transistor module 10' may for example replace transistor module 10 in system 1 of FIG. 2A. Transistor module 10' differs from transistor module 10 in that transistor module 10' further comprises a power transistor $M_{PT}$ that is electrically connected between first terminal 11*a* and a fifth terminal 11*e*. A control terminal of power transistor $M_{PT}$ is electrically connected to second terminal 11*b*.

Power transistor $M_{PT}$ may be configured as an 'always-on' device. For example, power transistor $M_{PT}$ may be a depletion-mode transistor. A current through power transistor $M_{PT}$ can then be controlled by activating or deactivating primary transistor $M_P$ by controlling the control terminal thereof accordingly, for example using a driving circuit (not shown). In other words, primary transistor $M_P$ may act as a switch for enabling a current through power transistor $M_{PT}$, and primary transistor $M_P$ is configured to enable a current flow through said power transistor $M_{PT}$ based on a voltage at the control terminal (e.g., gate terminal) of primary transistor $M_P$.

Power transistor $M_{PT}$ may have a high voltage handling capability and current-handling capability and may thus be particularly useful in application requiring high power handling, such as various types of converters (e.g., DC-DC, AC-DC or DC-AC), circuit breakers or other switching circuits.

In an embodiment, power transistor $M_{PT}$ may be a gallium-nitride (GaN) based high electron mobility transistor (HEMT). For example, power transistor $M_{PT}$ may have a voltage rating of over 500 V, such as 650 V. In turn, primary transistor $M_P$ (and preferably also secondary transistor $M_S$) may be a silicon (Si) based MOSFET, which may have a lower voltage rating than power transistor $M_{PT}$, such as 50 V or 30 V. Therefore, if transistor module 10' is electrically connected to an external node via fifth terminal 11*e*, power transistor $M_{PT}$ may have a suitable voltage handling capability to handle voltages during operation, while primary transistor $M_P$ is configured to enable or disable power transistor $M_{PT}$ by enabling or disabling a corresponding current path.

During operation, when primary transistor $M_P$ is activated, substantially all of the current flowing through power transistor $M_{PT}$ will also flow through primary power transistor $M_P$, such that a remaining portion of system 1 of FIG. 2A can still be employed to sense the current through primary transistor $M_P$ which in turn may reflect the current through power transistor $M_{PT}$. A detailed description of the operation of system 1 is already provided with reference to FIG. 2A, and is thus omitted for FIG. 2B.

Figure 3:
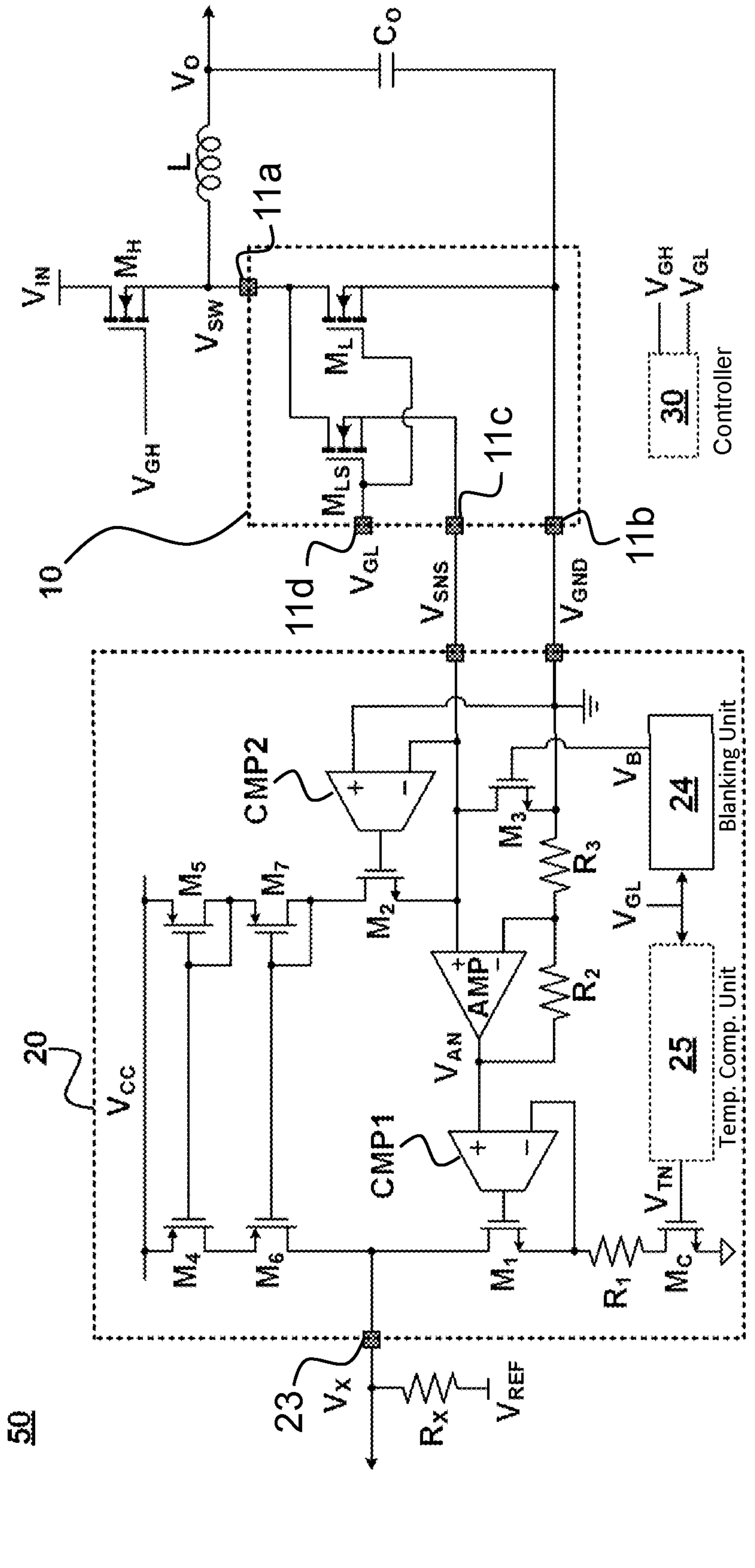
FIG. 3 is a schematic diagram of a DC-DC converter in accordance with an embodiment of the present disclosure.

In FIG. 3, a DC-DC converter 50 in accordance with an embodiment of the present disclosure is shown. DC-DC converter 50 comprises a system as described with reference to FIG. 2A, including transistor module 10 and current sensing module 20. In this embodiment, DC-DC converter 50 comprises a high-side switching transistor $M_H$ and a low-side switching transistor $M_L$, the latter embodying primary transistor $M_P$ of transistor module 10 as shown in FIG. 2A. Similarly, a low-side sensing transistor $M_{LS}$ as shown in FIG. 3 corresponds to secondary transistor $M_S$ of transistor module 10 shown in FIG. 2A.

DC-DC converter 50 may further comprise a controller 30 configured to control (e.g., enable or disable) various components thereof. For example, a driving module (e.g., driving module 103 of FIG. 1) may be comprised in controller 30, which driving module provides control signals $V_{GH}$ and $V_{GL}$ for high-side and low-side switching transistor $M_H$, $M_L$, respectively. For convenience, electrical connections from controller 30 to other components of DC-DC converter 50 are omitted from FIG. 3.

High-side switching transistor $M_H$ is electrically connected between an input voltage $V_{IN}$ received from an input voltage supply (not shown), and a first terminal of inductor L. Low-side switching transistor $M_L$ is electrically connected between first terminal 11*a*, which is connected to the first terminal of inductor L, and second terminal 11*b*, which is electrically connected to a ground potential $V_{GND}$. A switch node $V_{SW}$ is electrically connected to the first terminal of inductor L, and a voltage at said switch node may for example depend on which transistor among high-side and low-side switching transistor $M_H$, $M_L$ is activated, and on a current through said activated transistor. A second terminal of inductor L is connected to an output node $V_O$ of DC-DC converter 50. Furthermore, an output capacitor $C_O$ may be electrically connected between output node $V_O$ and ground potential $V_{GND}$. Input capacitor $C_I$ of FIG. 1 is not shown in FIG. 3, but may nevertheless be implicitly present.

In another embodiment, transistor module 10 may be replaced with transistor module 10' of FIG. 2B. In that case, fifth terminal 11*e* of transistor module may be directly or indirectly connected to switch node $V_{SW}$, rather than fourth terminal 11*d* as shown in FIG. 3. In that case, power transistor $M_{PT}$ may be directly or indirectly electrically connected to said switch node $V_{SW}$. In this manner, when power transistor $M_{PT}$ has a high voltage handling capability, a reliability of DC-DC converter under high voltage operating conditions can be improved.

Current sensing module 20 may further comprise an amplifying unit formed by amplifier AMP and a resistive feedback network, the latter being comprised of a second resistor $R_2$ and a third resistor $R_3$. Amplifier AMP may be an operational amplifier. In this configuration, a voltage $V_{AN}$ at an output of amplifier AMP is equal to $V_{AN}=V_{SNS}*(1+R_2/R_3)$. In an example, $R_2/R_3$ is selected such that $V_{AN}=100*V_{SNS}$. In another example, $R_2\approx 0$, in which case the amplifying unit has an amplification factor substantially equal to unity and effectively forms a buffer, such that $V_{AN}\approx V_{SNS}$. Amplifier AMP may present a high impedance between second terminal 11*b* and third terminal 11*c*. For convenience, a biasing circuit for amplifier AMP is omitted from FIG. 3.

In the embodiment shown in FIG. 3, first sensing unit 21 is embodied by a first comparing unit CMP1, a first transistor $M_1$ and an electrical network formed by a resistor $R_1$ and, optionally, a compensation transistor $M_C$. Compensation transistor $M_C$ may be employed to mimic a same on-resistance performance as that of low-side switching transistor $M_L$ under different temperatures to improve current sensing accuracy in the first mode. Temperature compensation may be adopted by a temperature compensation unit 25 configured to control a control terminal of compensation transistor $M_C$ based on a temperature sensed at or near low-side switching transistor $M_L$. Temperature compensation can be disabled by setting the control terminal of compensation transistor $M_C$ to a same value as a voltage at fourth terminal 11*d* with respect to the voltage at second terminal 11*b*. For example, in the embodiment shown in FIG. 3, temperature compensation can be disabled by setting $V_{TN}=V_{GL}$.

First comparing unit CMP1 compares a voltage at its non-inverting input to a voltage at its inverting input, and outputs a first control signal in accordance with a result of the comparison to a control terminal (e.g., a gate terminal) of first transistor $M_1$.

In the first mode, since $V_{SNS}>V_{GND}$, first comparing unit CMP1 and first transistor $M_1$ form a first negative feedback loop in which a first current through first transistor $M_1$ is adjusted until the voltage at the inverting input of first comparing unit CMP1 equals the voltage at its non-inverting input. In other words, in absence of the above-described amplifying unit, the voltage difference between third terminal 11*c* and second terminal 11*b* is provided at the inverting input of first comparing unit CMP1 via the first negative feedback loop. If the amplifying unit is included, the output voltage $V_{AN}$ of amplifier AMP is provided at the inverting input of first comparing unit CMP1. In the embodiment shown in FIG. 3, the first current may be equal to $(i_L*R_{on\_L})*(1+R_2/R_3)/(R_1+R_{on1})$, wherein $i_L$ and $R_{on\_L}$ are the current and on-resistance through low-side switching transistor $M_L$, respectively, and $R_{on1}$ is an on-resistance of compensation transistor $M_C$.

The first current generated by first sensing unit 21 in the first mode may then correspond directly to the first output signal. Alternatively, the first current is fed into a resistor $R_X$ coupled between output terminal 23 and a reference voltage $V_{REF}$, which resistor $R_X$ may be external to current sensing module 20 and may be external to system 1, to generate a corresponding first voltage at output terminal 23 which can be used by a controller external to DC-DC converter 50.

However, in the second mode, since $V_{SNS}\approx V_{GND}$, the output voltage $V_{AN}$ of amplifier AMP will be substantially equal to zero, such that the inverting input of first comparing unit CMP1 will also be substantially equal to zero. As a result, first sensing unit 21 is automatically disabled, and hence the first current is substantially equal to zero.

First comparing unit CMP1 may be a high gain amplifier, such as an operational amplifier or a transconductor. A gain of first comparing unit CMP1 increases the closed-loop gain of the first negative feedback loop and, hence, can improve a current sensing accuracy of first sensing unit 21 in the first mode.

In the embodiment shown in FIG. 3, second sensing unit 22 is embodied by a second comparing unit CMP2 and a second transistor $M_2$ electrically connected between a reference voltage $V_{CC}$ and third terminal 11*c*. A non-inverting input thereof is electrically connected to second terminal 11*b*, and an inverting input thereof is electrically connected to third terminal 11*c*. Second comparing unit CMP2 compares a voltage at its non-inverting input to a voltage at its inverting input, and outputs a second control signal in accordance with a result of the comparison to a control terminal (e.g., a gate terminal) of second transistor $M_2$.

In the second mode, when initially $V_{SNS}<V_{GND}$, second comparing unit CMP2 and second transistor $M_2$ form a second negative feedback loop in which a second current through second transistor $M_2$ is adjusted until the voltage at the inverting input of second comparing unit CMP2 substantially equals the voltage at its non-inverting input, i.e., until $V_{SNS}\approx V_{GND}$. The second current also substantially flows through low-side sensing transistor $M_{LS}$, since first sensing unit 21 is disabled in the second mode or has a high input impedance. Under this condition, low-side sensing transistor $M_{LS}$ and low-side switching transistor $M_L$ are effectively fully in parallel, such that the second current is substantially equal to the current through low-side switching transistor $M_L$ divided by $N_S$, wherein $N_S$ is the relative scaling of low-side switching transistor $M_L$ with respect to low-side sensing transistor $M_{LS}$.

The second current generated by second sensing unit 21 in the second mode may then correspond directly to the second output signal. Alternatively, a scaled second current is provided to output terminal 23 as the second output signal via a cascoded current mirror formed by transistors $M_4$-$M_7$ and coupled to reference voltage $V_{CC}$, as will be appreciated by the person skilled in the art. In some embodiments, cascode transistors $M_6$ and $M_7$ may be omitted, and the current mirror may be formed only by transistors $M_4$ and $M_5$. The (cascoded) current mirror may have a scaling factor $N_C$, such that a current in a first branch of the current mirror formed by transistor $M_5$ (and transistor $M_7$) is $N_C$ times a current in a second branch formed by transistor $M_4$ (and transistor $M_6$). Hence, the second output signal may be current corresponding to $i_L/(N_S*N_C)$. Similarly, to the first current, the second current may be fed into resistor $R_X$ to generate a corresponding second voltage at output terminal 23 which can be used by a controller external to DC-DC converter 50.

However, in the first mode, since $V_{SNS}>V_{GND}$, second comparing unit CMP2 may provide a ‘low’ signal to second transistor $M_2$, such that the second current is substantially equal to zero. In other words, in the first mode, second sensing unit 22 is automatically (substantially) disabled.

To have a same absolute current sensing ratio for both currents in the first current direction and currents in the second current direction, values for the various components can be chosen such that $R_{on\_L}=(R_{on1}+R_1)*R_3/[N_C*N_S*(R_2+R_3)]$. Under this condition, the first output signal and the second output signal will have a substantial equal sensitivity to a current flowing through low-side switching transistor $M_L$.

Second comparing unit CMP2 may be a high gain amplifier, such as an operational amplifier or a transconductor. A gain of second comparing unit CMP2 increases the closed-loop gain of the second negative feedback loop and, hence, can improve a current sensing accuracy of second sensing unit 22 in the second mode.

It will be appreciated that, while system 1 is applied to low-side switching transistor $M_L$ in FIG. 3, it may instead or in addition to that be applied, in a similar manner, to high-side switching transistor $M_H$ for the purpose of sensing a current through said high-side switching transistor $M_H$. A detailed description thereof is therefore omitted.

To mitigate parasitic impedance impacts on the current sensing accuracy during turn-on and turn-off transitions at the control terminals of low-side switching transistor $M_L$ (and/or high-side switching transistor $M_H$), system 1 may further comprise a third transistor $M_3$ electrically connected between second terminal 11*b* and third terminal 11*c*, and a blanking unit configured to generate a voltage pulse VB having a predetermined width and to provide said pulse to a control terminal of the third transistor based on $V_{GL}$ (or $V_{GH}$). The voltage pulse may be configured to enable the third transistor to form a low-impedance path between second terminal 11*b* and third terminal 11*c* for a duration corresponding to the predetermined width. The predetermined width can be set in accordance with a time required for the control terminal voltage to settle (e.g., a gate charging time). When low-side switching transistor $M_L$ and low-side sensing transistor $M_{LS}$ are turned off (i.e., when $V_{GL}$ is 'low'), blanking unit 24 may be configured to activate third transistor $M_3$ to avoid false triggering of current sensing module 20.

In some embodiments, at least part of current sensing module 20 is realized in an integrated circuit. In some embodiments, current sensing module 20 is implemented as a separate integrated circuit with respect to transistor module 10. In some embodiments, system 1 (e.g., transistor module 10 and current sensing module is formed as a single integrated circuit. In some embodiments, at least part of DC-DC converter 50 is formed as a single integrated circuit.

Figure 4:
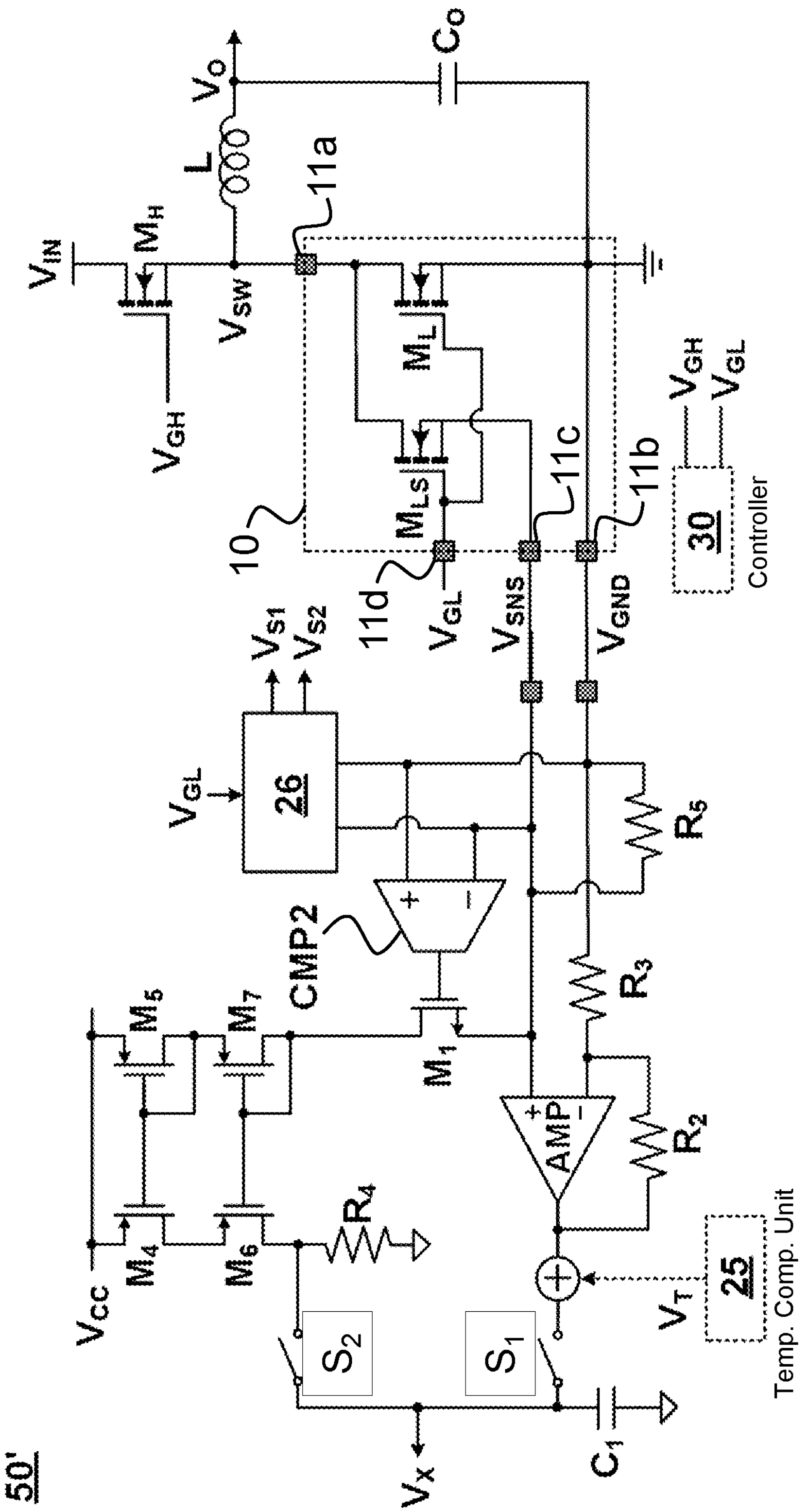
FIG. 4 is a schematic diagram of a DC-DC converter in accordance with another embodiment of the present disclosure.

In FIG. 4, a DC-DC converter 50' according to another embodiment of the present disclosure is shown. DC-DC converter 50' of FIG. 4 differs from DC-DC converter 50 in FIG. 3 mainly in the following. It is noted that similar or identical parts may operate in a substantially similar or identical manner, and a detailed description is therefore omitted for those parts.

In DC-DC converter 50', current sensing module 20 generates voltages instead of currents as the first and second output signal. In particular, first sensing unit 21 directly uses an output voltage of amplifier AMP and provides said output voltage of amplifier AMP as the first output signal to output terminal 23 via a first switch $S_1$. Current sensing module 20 may further comprise a first capacitor $C_1$ electrically connected between output terminal 23 and a reference terminal (e.g., ground). Alternatively, first capacitor $C_1$ is external to current sensing module 20 or external to system 1.

First switch $S_1$ may be controlled by first switch voltage $V_{S1}$ generated by a signal generation unit 26 based on a voltage $V_{GL}$ at the control terminal of low-side switching transistor $M_L$ and at third terminal 11*c* with respect to second terminal 11*b*. For example, signal generation unit 26 may detect whether low-side switching transistor $M_L$ is activated based on $V_{GL}$, and may in turn determine whether the current therethrough is in the first or second current direction based on the voltage difference between second and third terminal 11*b*, 11*c*. If the current direction is the first current direction, first switch $S_1$ is activated, and if the current direction is the second current direction, first switch $S_1$ is deactivated. In other words, first switch $S_1$ is activated in the first mode and deactivated in the second mode.

Optionally, temperature compensation unit 25 may be configured to adjust the second voltage signal to correct for a temperature at or near low-side switching transistor $M_L$ prior to providing it as the first output signal to output terminal 23 via first switch $S_1$. As an example only, temperature compensation unit 25 may add (or subtract) a voltage value to (or from) the second voltage signal based on a look-up table to correct for a change in on-resistance of low-side switching transistor $M_L$ due to a change in temperature.

Further to the above, in DC-DC converter 50', second sensing unit 22 may be configured to generate a second voltage signal by feeding the (scaled) second current into a fourth resistor $R_4$, and provides said second voltage signal to output terminal 23 via a second switch $S_2$. Similarly to first switch $S_1$, second switch $S_2$ may be controlled by second switch voltage $V_{S2}$ generated by signal generation unit 26 based on a voltage $V_{GL}$ at the control terminal of low-side switching transistor $M_L$ and at third terminal 11*c* with respect to second terminal 11*b*. If the current direction is the first current direction, second switch $S_2$ is deactivated, and if the current direction is the second current direction, second switch $S_2$ is activated. In other words, second switch $S_2$ is deactivated in the first mode and activated in the second mode.

As shown in FIG. 4, DC-DC converter 50' may further comprise a fifth resistor $R_5$ electrically connected between second terminal 11*b* and third terminal 11*c* to reduce a node impedance at third terminal 11*c* when voltage $V_{GL}$ at the control terminal of low-side switching transistor $M_L$ is 'low', that is, when low-side switching transistor $M_L$ is controlled to be deactivated.

In FIGS. 2A, 2B, 3 and 4, the system according to various embodiments of the present disclosure (e.g., system 1 of FIG. 2A) is shown as being comprised in a DC-DC converter. However, it will be appreciated that the present disclosure is not limited thereto. In particular, the system according to the present disclosure may be applied to various other applications comprising a transistor corresponding to the 'primary transistor' through which a current is to be sensed. Other applications that may employ the system according to the present disclosure may be applications including, but not limited to, (switching) converters or inverters such as AC-DC, DC-DC, and DC-AC converters, smart switches such as a hot-swap circuit breaker, bidirectional load switches or power meters, digital systems and amplifiers.

The ensuing description above provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including various modifications and/or combinations of features from different embodiments, without departing from the scope of the present disclosure as defined by the appended claims.

What is claimed is:

1. A system, comprising:
- a transistor module, comprising:
  - a primary transistor electrically connected between a first terminal and a second terminal, the primary transistor having a control terminal; and
  - a secondary transistor electrically connected between the first terminal and a third terminal, wherein the secondary transistor has a control terminal that is electrically connected to a control terminal of the primary transistor; and
- a current sensing module electrically connected to the transistor module and has an output terminal, wherein the system is configured to be operable in a first mode in which the current sensing module is configured to:

present an impedance between the second terminal and the third terminal so that a voltage at the third terminal is substantially equal to the voltage at the first terminal; and output a first output signal at the output terminal that is indicative of a current through the primary transistor in a first current direction based on a voltage difference between the third terminal and the second terminal, wherein the first current direction is from the first terminal to the second terminal.

2. The system according to claim 1, wherein the current sensing module comprises a first sensing unit comprising:

a first comparing unit having a first input terminal and a second input terminal and being configured to:

compare a voltage at an intermediate node, received at the first input terminal, to a voltage corresponding to the voltage difference between the third terminal and the second terminal, received at the second input terminal; and generate a first control signal based on a result of the comparison; and a first transistor connected between the output terminal of the current sensing module and the intermediate node, the first transistor being configured to receive, at a control terminal thereof, the first control signal and to enable a first current to flow between the output terminal and the intermediate node based on the first control signal, wherein the first current corresponds to the first output signal or is used to generate the first output signal.

3. The system according to claim 2, wherein the primary transistor and the secondary transistor are metal-oxide-semiconductor field-effect transistors (MOSFETs), wherein the first transistor is a MOSFET.

4. The system according to claim 2, wherein the first sensing unit further comprises an electrical network electrically connected between the first transistor and a reference terminal connected to a reference voltage, wherein the first current additionally flows through the electrical network;

wherein the first comparing unit and the first transistor together form at least part of a first negative feedback loop configured to adjust the first current so that the voltage at the first input terminal and the voltage at the second input terminal are substantially equal, wherein the adjusted first current corresponds to the first output signal or is used to generate the first output signal; and wherein the electrical network comprises a compensation transistor, and wherein the current sensing module further comprises a temperature compensation unit configured to sense a temperature at or near the primary transistor and to control a control terminal of the compensation transistor so that an on-resistance of the compensation transistor substantially corresponds to that of the primary transistor during operation.

5. The system according to claim 1, wherein the current sensing module comprises a first switch configured to, when the system is operating in the first mode, provide a first voltage signal corresponding to the voltage difference between the third terminal and the second terminal to the output terminal of the current sensing module, the first voltage signal corresponding to the first output signal or being used to generate the first output signal, wherein the system further comprises a temperature compensation unit configured to adjust the first voltage signal based on a temperature at or near the primary transistor.

6. The system according to claim 1, wherein the current sensing module further comprises an amplifying unit electrically connected between the transistor module and a first sensing unit, wherein the amplifying unit is configured to amplify the voltage difference between the third terminal and the second terminal, and wherein the current sensing module is configured to generate the first output signal based on the amplified voltage difference between the third terminal and the second terminal.

7. The system according to claim 1, wherein the system is further configured to be operable in a second mode in which the current sensing module is configured to output, at the output terminal, a second output signal indicative of a current through the primary transistor in a second current direction, the second current direction being from the second terminal to the first terminal;

wherein to output the second output signal, the current sensing module is configured to:

adjust a current through the secondary transistor so that a voltage at the third terminal substantially equals a voltage at the second terminal; and output the second output signal based on the adjusted current.

8. The system according to claim 7, wherein the current sensing module comprises a second sensing unit comprising:

a second comparing unit configured to compare a voltage at the second terminal to a voltage at the third terminal, and to generate a second control signal based on a result of the comparison; and a second transistor connected between the third terminal and a reference terminal, wherein the second transistor is configured to receive the second control signal at a control terminal thereof, and to enable a second current to flow from the reference terminal to the secondary transistor through the second transistor based on the second control signal, the second current corresponding to the second output signal or being used to generate the second output signal, wherein the second comparing unit and the second transistor together form at least part of a second negative feedback loop configured to adjust the second current so that the voltage at the second terminal and the voltage at the third terminal are substantially equal.

9. The system according to claim 8, wherein the current sensing module further comprises a current mirror configured to receive the second current in a first branch thereof and to generate a scaled second current signal corresponding to the second current times a predetermined factor in a second branch thereof, wherein the second branch of the current mirror is directly or indirectly electrically connected to the output terminal, wherein the second current signal corresponds to the second output signal, or wherein the second current signal is fed into a resistor to generate a second voltage signal corresponding to the second output signal.

10. The system according to claim 9, wherein the current sensing module further comprises a second switch configured to, when the system is operating in the second mode, provide the second voltage signal to the output terminal of the current sensing module as the second output signal.

11. The system according to claim 8, wherein the primary transistor and the secondary transistor are metal-oxide-semiconductor field-effect transistors (MOSFETs), wherein the second transistor is a MOSFET.

12. The system according to claim 1, further comprising: a third transistor electrically connected between the second terminal and the third terminal; and a blanking unit configured to generate a pulse having a predetermined width and provide the pulse to a control terminal of the third transistor based on a voltage signal at the control terminals of the primary and secondary transistors, wherein the pulse is configured to enable the third transistor to form a low-impedance path between the second terminal and the third terminal for a duration corresponding to the predetermined width.

13. The system according to claim 12, wherein the primary transistor and the secondary transistor are metal-oxide-semiconductor field-effect transistors (MOSFETs), wherein the third transistor is a MOSFET.

14. The system according to claim 1, wherein the primary transistor and the secondary transistor have a scale ratio of $N_S$:1, respectively, wherein $N_S$ is greater than unity; and/or wherein the primary transistor and the secondary transistor are integrated on a same semiconductor die, or wherein the primary transistor is integrated on a first semiconductor die and the secondary transistor is integrated on a second semiconductor die separate from the first semiconductor die, wherein the current sensing module is at least partially realized as an integrated circuit.

15. The system according to claim 1, wherein the primary transistor and the secondary transistor have a scale ratio of $N_S$:1, respectively, wherein $N_S$ is greater than unity; and/or wherein the primary transistor and the secondary transistor are integrated on a same semiconductor die, or wherein the primary transistor is integrated on a first semiconductor die and the secondary transistor is integrated on a second semiconductor die separate from the first semiconductor die, wherein the current sensing module is at least partially integrated on a third semiconductor die different from the semiconductor die(s) on which the primary transistor and/or the secondary transistor are integrated.

16. The system according to claim 1, wherein the transistor module further comprises a power transistor electrically connected between the first terminal and a fifth terminal; and wherein the power transistor has a control terminal that is electrically connected to the second terminal or to a reference voltage, and wherein the current through the primary transistor additionally substantially flows through the power transistor, wherein the power transistor is a Gallium Nitride (GaN) based high electron mobility transistor (HEMT), and is a depletion mode transistor, and wherein the primary transistor is Silicon (Si) based; and wherein the power transistor has a higher voltage handling capability than the primary transistor.

17. A DC-DC converter, comprising a first system configured as the system according to claim 1, wherein the primary transistor of the first system corresponds to a switching transistor of the DC-DC converter.

18. A DC-DC converter, comprising a first system and a second system, wherein both the first system and the second system are configured as the system according to claim 1, wherein the primary transistor that the first system corresponds to is a switching transistor of the DC-DC converter; and wherein the DC-DC converter comprises a high-side switching transistor and a low-side switching transistor, wherein the primary transistor of the first system corresponds to the high-side switching transistor, and wherein the primary transistor of the second system corresponds to the low-side switching transistor.

19. The system according to claim 1, wherein the impedance between the second terminal and the third terminal presented by the current sensing module during at least part of the operation in the first mode and configured to limit or prevent a current through the secondary transistor so that the voltage at the third terminal becomes substantially equal to the voltage at first terminal.

* * * * *